(12) United States Patent
Tabelander (10) Patent No.: US 11,953,383 B2
(45) Date of Patent: Apr. 9, 2024

(54) TEMPERATURE DETERMINATION DEVICE

(71) Applicant: ABB Schweiz AG, Baden (CH)

(72) Inventor: Stefan Tabelander, Herford (DE)

(73) Assignee: ABB Schweiz AG, Baden (CH)

( * ) Notice: Subject to any disclaimer, the term of this patent is extended or adjusted under 35 U.S.C. 154(b) by 636 days.

(21) Appl. No.: 17/110,367

(22) Filed: Dec. 3, 2020

(65) Prior Publication Data

US 2021/0181031 A1    Jun. 17, 2021

(30) Foreign Application Priority Data

Dec. 11, 2019  (EP) .................................. 19 215 339

(51) Int. Cl.
*G01K 1/143* (2021.01)
*G01K 1/022* (2021.01)
*H03K 17/945* (2006.01)

(52) U.S. Cl.
CPC ............. *G01K 1/143* (2013.01); *G01K 1/022* (2013.01); *H03K 17/945* (2013.01); *G01K 2215/00* (2013.01)

(58) Field of Classification Search
CPC .... G01K 1/143; G01K 1/022; G01K 2215/00; H03K 17/945
See application file for complete search history.

(56) References Cited

U.S. PATENT DOCUMENTS

| 8,220,346 | B2 * | 7/2012 | Arzberger ............ | B22D 11/202 73/866.5 |
| 2007/0086508 | A1 * | 4/2007 | Reading ................ | G01K 1/026 374/E1.005 |
| 2008/0157987 | A1 | 7/2008 | Hedtke | |
| 2014/0105248 | A1 * | 4/2014 | Daily ....................... | G01K 1/14 374/179 |
| 2019/0063804 | A1 | 2/2019 | Murray | |

FOREIGN PATENT DOCUMENTS

| CN | 104132741 A | 11/2014 |
| CN | 107532944 A | 1/2018 |
| CN | 108414101 A | 8/2018 |
| CN | 108844647 A | 11/2018 |
| JP | 2010091310 A | 4/2010 |
| JP | 2013-164342 A | 8/2013 |
| WO | WO 9703342 A1 | 1/1997 |

OTHER PUBLICATIONS

Nakatsuka, "Contact Thermometer", Translation of JP2010091310A. (Year: 2010).*

* cited by examiner

*Primary Examiner* — Gail Kaplan Verbitsky
(74) *Attorney, Agent, or Firm* — Leydig, Voit & Mayer, Ltd.

(57) ABSTRACT

A temperature determination device includes: a temperature sensor; a mount; and at least one connection sensor. The temperature sensor is connectable to a process device via the mount. The temperature sensor acquires temperature data. The at least one connection sensor acquires connection status data relating to connection of the temperature sensor to the process device. The temperature determination device utilizes the temperature data and the connection status data with respect to a determination of a temperature of the process device.

14 Claims, 4 Drawing Sheets

TEMPERATURE DETERMINATION DEVICE

CROSS-REFERENCE TO PRIOR APPLICATION

Priority is claimed to European Patent Application No. EP 19 215 339.3, filed on Dec. 11, 2019, the entire disclosure of which is hereby incorporated by reference herein.

FIELD

The present invention relates to a temperature determination device.

BACKGROUND

Non-invasive temperature measurement products generally utilize surface mounted sensors, to measure for example the surface temperature of a pipe or vessel. To do so, sensor or sensors must be linked to the surface with an low thermal resistance. If this not achieved, the measurement result is significantly influenced, so that the accuracy as stated in the user datasheet is not reached. For that reason, the user manual suggests and describes the steps that are important to mount the product and its sensors correctly in order to achieve its maximum accuracy under all conditions. The steps can, for instance, involve preparing an even mounting surface below the sensor tip, but also thermally to insulate the measuring point with for example insulating wool. Furthermore, it is important to protect against other environmental influences like humidity or rain and mechanical impacts.

The accuracy within a dedicated range is especially important for future safety applications in a safety related rating (SIL) context of high importance. This can even be a broader range than that within the datasheet measuring accuracy, but applies in the safety context. Accurate and safe operation must either be provided by design, or safely determined that in an appropriate situation a failure generating diagnostic information is communicated to the host system. The more precise the determination works, the higher will be the safety related rating (SIL level).

In the correct mounting scenario, the sensor tip is linked or connected to the surface of the process device for which the temperature is to be measured, and the temperature sensor is generally oriented perpendicularly to the surface, which can be in a vertical manner. A spring is usually used to force the tip of the temperature sensor onto the process device, producing a force fit connection that thermally links the sensor tip with the measuring surface. During operation it is assumed that the integrity of this force fit connection is maintained.

In reality though, there are influencing factors that can cause deviations to this ideal mounting arrangement, and that then lead to errors in the temperature measurement. This can be due to the following reasons:

High and continuous shock and vibrations can cause the mounting to become loose, where that mounting is for example via mounting bands or brackets. In such situations, the spring may not be able to maintain the force fit connection, and the sensor tip loses connection to the surface.

Breakages or damage to or of the spring: the spring can break or become damaged, or lose its ability to apply the required level of force, for example due to wear and tear, which can cause the above described temperature measurement problems Mounting bands or auxiliary components can break due to user failures during mounting of the instrument. For example too high torque can be applied or mounting screws may not be correctly installed Other mechanical influences would be apparent to the skilled person.

However, recognition of these influencing factors is low for the following reasons:

Normally there is no redundant measuring point (as a comparable process value) to determine if a measurement is in error and has deviated from the correct value.

Even regular visual inspection, only take place on a weekly or daily basis.

The measuring point itself is usually difficult to view, because this location is insulated with insulating wool against environmental influences.

Thus, to mitigate these influences appropriate mechanical designs are provided that are anticipated to maintain the temperature sensor in a correct measuring configuration. This means the above problems can go undetected, and this prevents or restricts the non-invasive technology from being used in safety applications.

There is a need to address this problem.

Therefore, it would be advantageous to have an improved temperature determination device.

SUMMARY

In an embodiment, the present invention provides a temperature determination device, comprising: a temperature sensor; a mount; and at least one connection sensor, wherein the temperature sensor is configured to be connected to a process device via the mount, wherein the temperature sensor is configured to acquire temperature data, wherein the at least one connection sensor is configured to acquire connection status data relating to connection of the temperature sensor to the process device, and wherein the temperature determination device is configured to utilize the temperature data and the connection status data with respect to a determination of a temperature of the process device.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an aspect, there is provided temperature determination device, comprising:
- a temperature sensor;
- a mount; and
- at least one connection sensor The temperature sensor is configured to be connected to a process device via the mount. The temperature sensor is configured to acquire temperature data. The at least one connection sensor is configured to acquire connection status data relating to connection of the temperature sensor to the process device. The temperature determination device is configured to utilize the temperature data and the connection status data with respect to a determination of a temperature of the process device.

In an example, the at least one connection sensor comprises one or more proximity sensors, and wherein the connection status data comprises proximity data.

In an example, a proximity sensor is configured to determine a proximity between the mount and the process device. The proximity data can then comprise the determined proximity between the mount and the process device.

Thus, the proximity data can comprises data relating to the integrity of the connection of the mount to the process device. In other words, how well the mount is connected to the process device.

In an example, a proximity sensor is configured to determine a proximity between the mount and the temperature sensor. The proximity data can then comprise the determined proximity between the mount and the temperature sensor.

Thus, the proximity data can comprises data relating to the integrity of the connection of the mount to the temperature sensor. In this way it can be determined if the mount is pushing the temperature sensor correctly against the process device as part of a force fit connection.

In an example, utilization of the connection status data with respect to the determination of a temperature of the process device comprises a comparison of the proximity data against baseline proximity data.

In an example, the at least one connection sensor comprises one or more position activated switches. The connection status data can then comprise position activation data.

In an example, a position activated switch is configured to determine a position status between the mount and the process device. The position activation data can then comprise the determined position status between the mount and the process device.

Thus for example, if the position activated switch is in an open position it can be determined that the mount is not correctly connected to the process device and thus the temperature sensor will also not be correctly positioned to acquire temperature data.

Thus for example, if the position activated switch is in a closed position it can be determined that the mount is correctly connected to the process device and thus the temperature sensor will also be correctly positioned to acquire temperature data.

Clearly, the open and close statuses of the activation switch could be reversed, in that closed position could indicate incorrect connection of the mount the process device.

In an example, a position activated switch is configured to determine a position status between the mount and the temperature sensor. The position activation data can then comprise the determined position status between the mount and the temperature sensor.

Thus for example, if the position activated switch is in an open position it can be determined that the mount is not correctly connected to the temperature sensor and thus the temperature sensor will also not be correctly positioned to acquire temperature data.

Thus for example, if the position activated switch is in a closed position it can be determined that the mount is correctly connected to the temperature sensor and thus the temperature sensor will also be correctly positioned to acquire temperature data.

Clearly, the open and close statuses of the activation switch could be reversed, in that closed position could indicate incorrect connection of the mount the process device.

Here connection of the mount to the temperature sensor can relate to the integrity of the force fit of the temperature sensor to the process device by the mount.

In an example, utilization of the connection status data with respect to the determination of a temperature of the process device comprises a comparison of the position activation data against baseline position activation data.

In an example, the at least one connection sensor comprises one or more force activated switches. The connection status data can comprise force activation data.

In an example, a force activated switch is configured to determine a force status between the mount and the process device. The force activation data can comprise the determined force status between the mount and the process device.

Thus, the force activation data can comprises data relating to the integrity of the connection of the mount to the process device. In this way it can be determined if the mount is correctly connected to the process device in order that the temperature sensor can correctly measure a temperature of the process device.

In an example, a force activated switch is configured to determine a force status between the mount and the temperature sensor. The force activation data can comprise the determined force status between the mount and the temperature sensor.

Thus, the force activation data can comprises data relating to the integrity of the connection of the mount to the temperature sensor. In this way it can be determined if the mount is pushing the temperature sensor correctly against the process device as part of a force fit connection.

In an example, utilization of the connection status data with respect to the determination of a temperature of the process device comprises a comparison of the force activation data against baseline force activation data.

In an example, the temperature determination device is configured to transmit the connection status data.

In an example, the temperature determination device is configured to transmit the temperature data.

The above aspects and examples will become apparent from and be elucidated with reference to the embodiments described hereinafter.

FIGS. 1-4 relate to a temperature determination device. In an example, the temperature determination device comprises a temperature sensor, a mount, and at least one connection sensor. The temperature sensor is configured to be connected to a process device via the mount. The temperature sensor is configured to acquire temperature data. The at least one connection sensor is configured to acquire connection status data relating to connection of the temperature sensor to the process device. The temperature determination device is configured to utilize the temperature data and the connection status data with respect to a determination of a temperature of the process device.

According to an example, the at least one connection sensor comprises one or more proximity sensors. The connection status data can comprise proximity data.

According to an example, a proximity sensor is configured to determine a proximity between the mount and the process device. The proximity data can comprise the determined proximity between the mount and the process device.

According to an example, a proximity sensor is configured to determine a proximity between the mount and the temperature sensor. The proximity data can comprise the determined proximity between the mount and the temperature sensor.

In an example, the one or more proximity sensors comprises one or more of: a magneto-resistive sensor; a capacitance sensor; a potentiometer; an inductance sensor.

In an example, the magneto-resistive sensor is one or more of: an Anisotropic Magneto Resistance (AMR) sensor; a Tunneling Magneto Resistance (TMR) sensor; a HALL sensor; a Feldplatte; an air-coil.

In an example, the inductance sensor is configured to measure an inductance of a spring utilized in providing a force fit connection of the temperature sensor to the process device.

According to an example, utilization of the connection status data with respect to the determination of a temperature of the process device comprises a comparison of the proximity data against baseline proximity data.

In an example, the baseline proximity data relate to a correct position of the temperature sensor.

In an example, the baseline proximity data relate to a correct position of the temperature sensor with respect to the process device.

In an example, the baseline proximity data relate to a correct position of the temperature sensor with respect to the mount.

In an example, the baseline proximity data relate to a correct position of the mount.

In an example, the baseline proximity data relate to a correct distance value of the temperature sensor.

In an example, the baseline proximity data relate to a correct distance value of the temperature sensor with respect to the process device.

In an example, the baseline proximity data relate to a correct distance value of the temperature sensor with respect to the mount.

In an example, the baseline proximity data relate to a correct distance value of the mount.

In an example, the baseline proximity data is determined after mounting or connection of the temperature sensor to the process device.

In an example, the baseline proximity data is determined after mounting or connection of the temperature sensor to the process device as part of a commissioning step.

According to an example, the at least one connection sensor comprises one or more position activated switches. The connection status data can comprise position activation data.

According to an example, a position activated switch is configured to determine a position status between the mount and the process device. The position activation data can comprise the determined position status between the mount and the process device.

According to an example, a position activated switch is configured to determine a position status between the mount and the temperature sensor. The position activation data can comprise the determined position status between the mount and the temperature sensor.

In an example, the one or more position activated switches comprises one or more of: a magneto-resistive sensor; a capacitive switch; a contact switch.

In an example, the magneto-resistive sensor is one or more of: a HALL switch; a slot indicator; Read contact switch with magnet.

In an example, contact switch is a micro-switch

According to an example, utilization of the connection status data with respect to the determination of a temperature of the process device comprises a comparison of the position activation data against baseline position activation data.

In an example, the baseline position activation data relate to a correct position of the temperature sensor.

In an example, the baseline position activation data relate to a correct position of the temperature sensor with respect to the process device.

In an example, the baseline position activation data relate to a correct position of the temperature sensor with respect to the mount.

In an example, the baseline position activation data relate to a correct position of the mount.

In an example, the baseline position activation data relate to a correct position of the mount with respect to the process device.

In an example, the baseline position activation data relate to a correct distance value of the temperature sensor.

In an example, the baseline position activation data relate to a correct distance value of the temperature sensor with respect to the process device.

In an example, the baseline position activation data relate to a correct distance value of the temperature sensor with respect to the mount.

In an example, the baseline position activation data relate to a correct distance value of the mount.

In an example, the baseline position activation data relate to a correct distance value of the mount with respect to the process device.

In an example, the baseline position activation data is determined after mounting or connection of the temperature sensor to the process device.

In an example, the baseline position activation data is determined after mounting or connection of the temperature sensor to the process device as part of a commissioning step.

According to an example, the at least one connection sensor comprises one or more force activated switches. The connection status data can comprise force activation data.

According to an example, a force activated switch is configured to determine a force status between the mount and the process device. The force activation data can comprise the determined force status between the mount and the process device.

According to an example, a force activated switch is configured to determine a force status between the mount and the temperature sensor. The force activation data can comprise the determined force status between the mount and the temperature sensor.

According to an example, utilization of the connection status data with respect to the determination of a temperature of the process device comprises a comparison of the force activation data against baseline force activation data.

In an example, the baseline force activation data relate to a correct force being applied to the temperature sensor.

In an example, the baseline force activation data relate to a correct force being applied to the temperature sensor with respect to the process device.

In an example, the baseline force activation data relate to a correct force being applied to the temperature sensor with respect to the mount.

In an example, the baseline force activation data relate to a correct force being applied to the mount.

In an example, the baseline force activation data relate to a correct force being applied to the mount with respect to the process device.

In an example, the baseline force activation data relate to a correct force being applied to the mount with respect to the temperature sensor.

In an example, the baseline force activation data relate to a correct position of the temperature sensor.

In an example, the baseline force activation data relate to a correct position of the mount.

In an example, the baseline force data relate to a correct distance value of the temperature sensor.

In an example, the baseline force data relate to a correct distance value of the temperature sensor with respect to the process device.

In an example, the baseline force data relate to a correct distance value of the temperature sensor with respect to the mount.

In an example, the baseline force data relate to a correct distance value of the mount.

In an example, the baseline force data relate to a correct distance value of the mount with respect to the process device.

In an example, the baseline force data is determined after mounting or connection of the temperature sensor to the process device.

In an example, the baseline force data is determined after mounting or connection of the temperature sensor to the process device as part of a commissioning step.

According to an example, the temperature determination device is configured to transmit the connection status data.

According to an example, the temperature determination device is configured to transmit the temperature data.

Thus, an arrangement is provided for the determination if the temperature sensor is not correctly positioned, or connected to a process device the temperature of which is being measured, enabling the integrity of the measured temperatures to be determined for non-invasive measurement and generation of a diagnostic information for safety applications. Thus, an alarm can be indicated and/or the diagnostic information can be viewed alongside the temperature data to determine it degree of validity, for example if the connection data goes outside of threshold values, the temperatures values can be determined to now not be of the required degree of accuracy, requiring remedial action to be undertaken. Thus, the connection sensor can then be communicatively coupled to transmitter electronics that can be used to generate diagnostics information and a signal to the upstream host system.

The determination and generation of a diagnostic information can also be separated from the instrument. In this case the information can be utilized to overload the input signal, e.g. when it is wired in series to the current loop. In case of a detected fault condition, it separates the transmitter electronics and interrupts the loop current signal (0 mA) which is a valid alarm current, but it may also set another alarm current >0 mA<4 mA (e.g. 3.6 mA). Thus, either an alarm signal is provided or the transmitter stops sending—incorrect—temperature data, or both of these effects can be provided.

FIGS. 1-4 show exemplar embodiments of the temperature determination device.

Correctly mounted, a spring activated force presses the sensor tip of a temperature sensor against the surface where the process temperature measurement is carried out. Inside the instrument or device, there are a couple of suitable locations that can serve as an indicator for the correct fitting of the instrument and that deliver the right attribute for a "desired position" or "desired location" or "desired force" or "desired proximity". At one or more of these locations, a connection sensor is located or positioned to acquire connection status data that enables it to be determined if the sensor tip of the temperature sensor is correctly positioned or located with respect to the process device, the temperature of which is being monitored.

The connection status data from one or more of these connection sensors can then be utilised to identify if a deviation in the accuracy of the temperature measurement is anticipated due to a failure of the mounting of the temperature sensor to the process device. This deviation is used in turn to generate diagnostic information inside the instrument that can be communicated to an upstream host system (e.g. as an alarm current or 0 mA/loop interruption).

Figure 1:
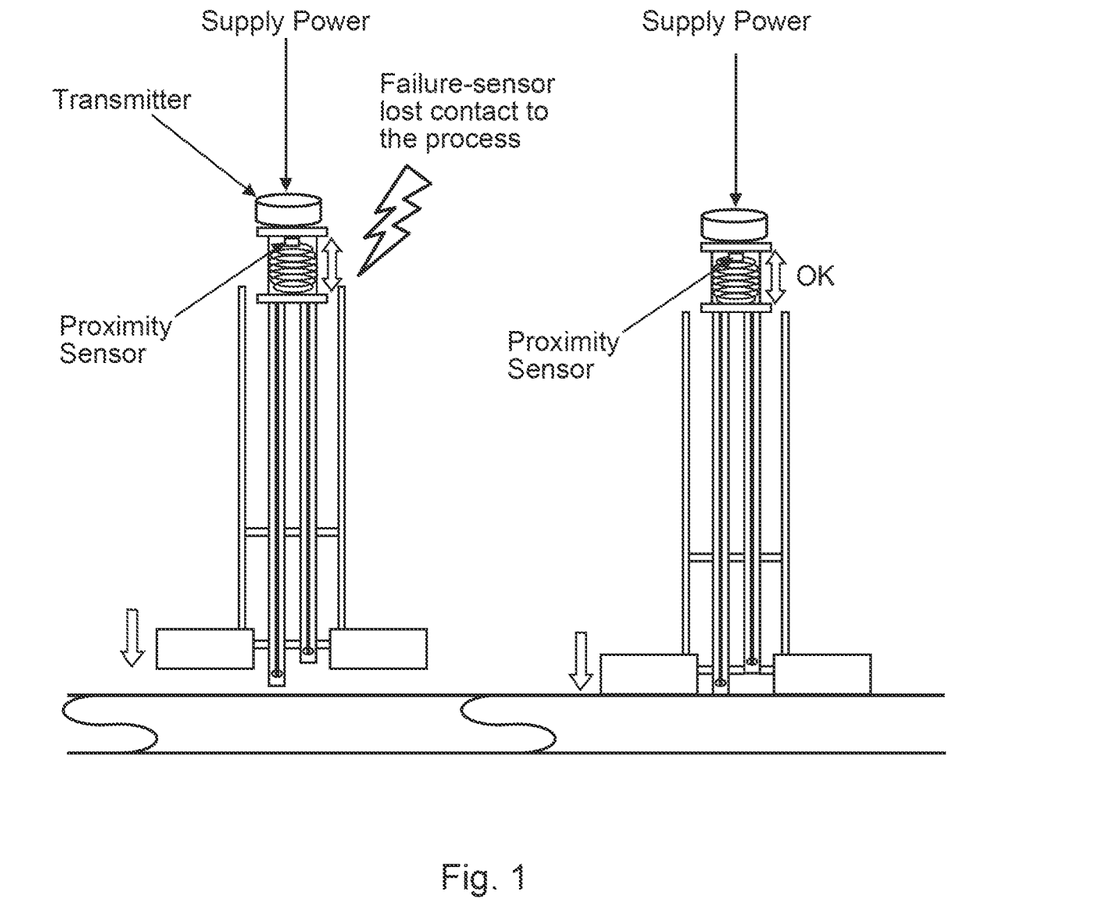
FIG. 1 shows an example of a temperature determination device on the left in an incorrect mounting situation and on the right in a correct mounting, where a proximity sensor is utilized.

FIG. 1 shows an exemplar temperature determination device, where determination of the correct force fit connection of a non-invasive (temperature) sensor to the process is undertaken through utilisation of the connection sensor that is configured to acquire proximity measurement data. The proximity measurement data can be:

measured through magneto-resistive sensors like AMR, TMR, HALL, Feldplatte, air-coil, etc.
  measured through capacitance or a potentiometer value.
  measured through the inductance of the spring that provides for the force fit connection.
  determined through knowledge of the correct position or distance value, or through setting the correct value after mounting as a commissioning step.

In the left-hand image of FIG. 1, the temperature determination device is incorrectly positioned for accurate temperature determination, where the proximity sensor data is utilised to indicate that the acquired temperature data is not valid, either through an alarm signal being transmitted, or through evaluation of the proximity sensor data itself with respect to expected of threshold values. In the right hand image of FIG. 1, the temperature determination device is correctly positioned, with the proximity sensor data being usable to indicate that the associated acquired temperature data is valid.

Figure 2:
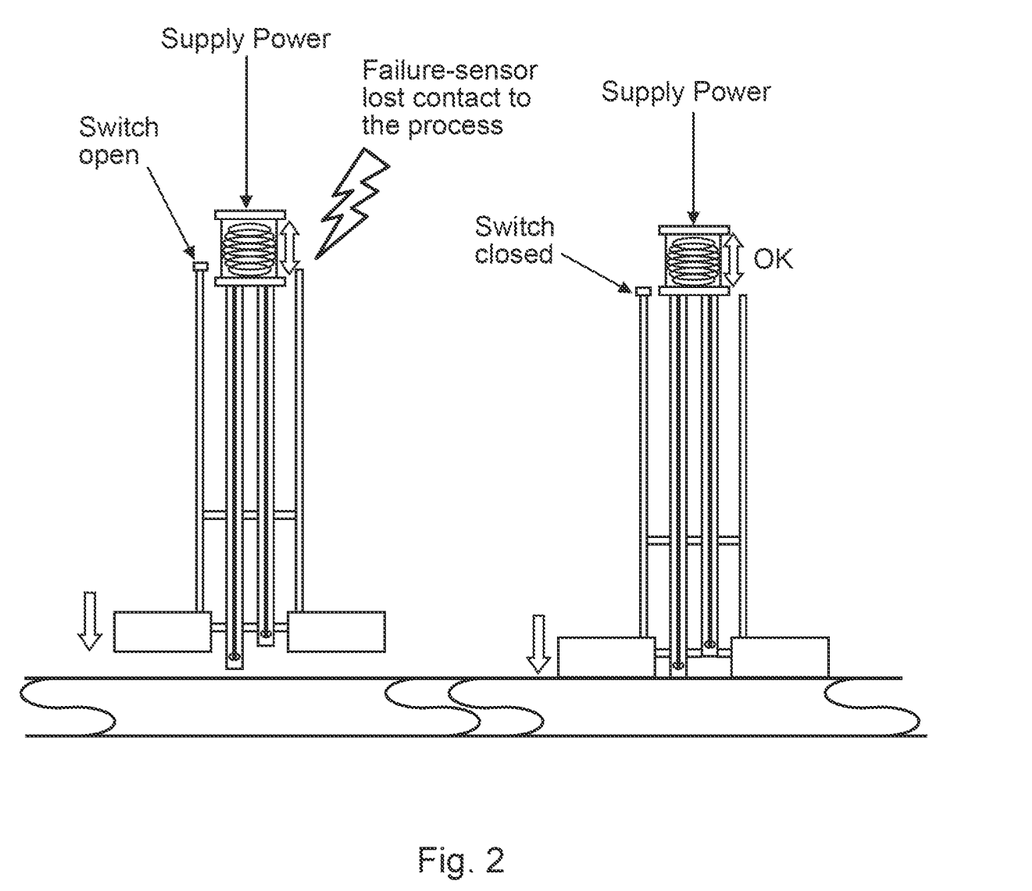
FIG. 2 shows an example of a temperature determination device on the left in an incorrect mounting situation and on the right in a correct mounting, where a position activated switch is utilized.

FIG. 2 shows an exemplar temperature determination device, where determination of the correct force fit connection of a non-invasive (temperature) sensor to the process is undertaken through utilisation of the connection sensor that is configured to acquire position activation switch data associated with a position switch. In this embodiment, the position switch is located away from the process device at a position usable to indicate if the mounting structure that provides force fit connection of the temperature sensor to the process device is incorrectly positioned or located with respect to the temperature sensor itself. The position activation switch data can relate to:

Position activated switch realized as a magneto-resistive switch (Hall switch, slot indicator, reed contact switch with magnet etc.)

Position activated switch realized as a capacitive switch

Position activated switch realized as a contact switch (e.g. micro-switch, etc.)

Switch being activated by knowledge of the correct position or distance value, or through setting the correct value after mounting as a commissioning step The switch can be connected to the transmitter where the diagnostic information is determined, or The switch is connected to an independent unit, that is connected to the transmitter current loop that can manipulate its loop current (e.g. simple interruption with 0 mA loop current or another valid alarm signal)

In the left-hand image of FIG. 2, the temperature determination device is incorrectly positioned for accurate temperature determination, with the switch in an open position with this used to indicate that the acquired temperature data is not valid, either through an alarm signal being transmitted, or through evaluation of the position activation switch data itself. In the right hand image of FIG. 2, the temperature determination device is correctly positioned, with the switch now in a closed position being usable to indicate that the associated acquired temperature data is valid.

Figure 3:
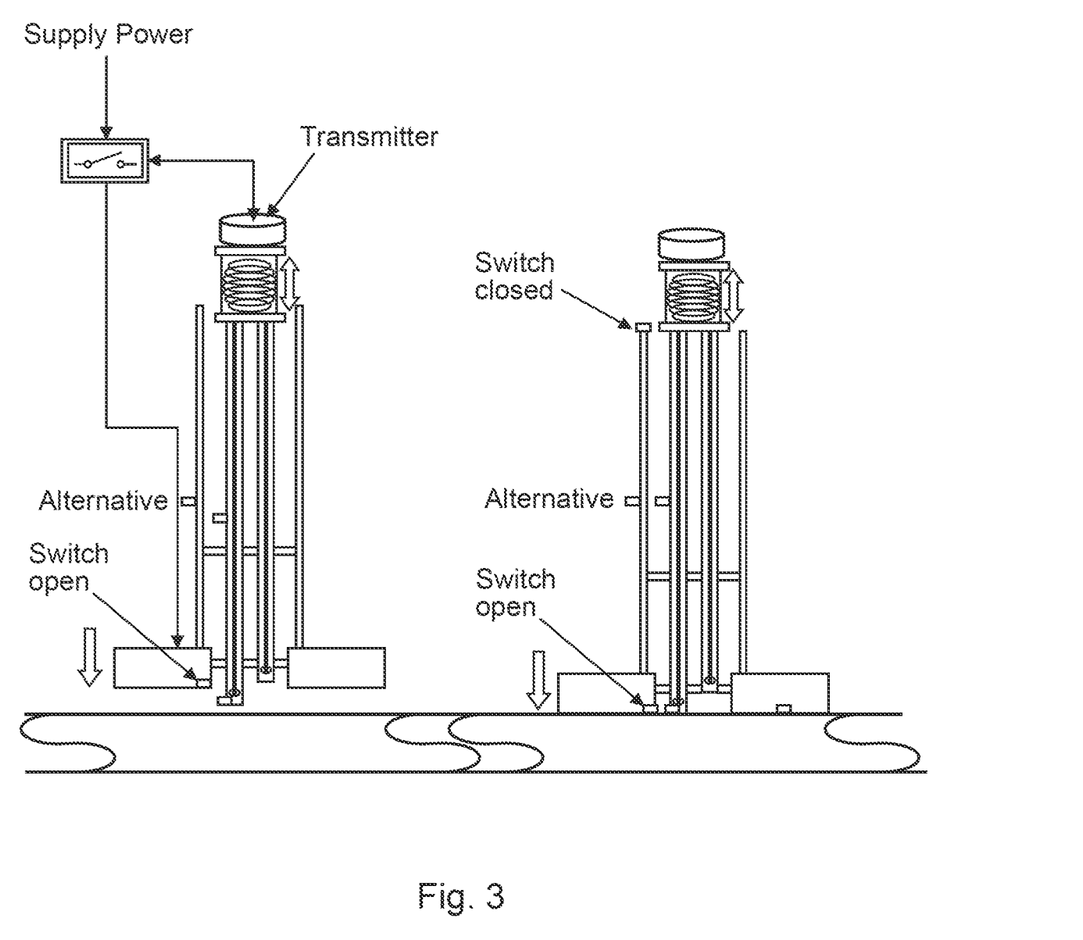
FIG. 3 shows an example of a temperature determination device on the left in an incorrect mounting situation and on the right in a correct mounting, where a position activated switch is utilized.

FIG. 3 shows a number of exemplar temperature determination devices, where determination of the correct force fit connection of a non-invasive (temperature) sensor to the process is again undertaken through utilisation of the connection sensor that is configured to acquire position activation switch data associated with a position switch.

Thus, the embodiment shown in FIG. 3 is similar to those shown for the embodiment in FIG. 2, except that the position switch can be located in a number of different positions. For example, the switch can be an open position and indicate that temperature data is invalid if the amount is not correctly connected to the process device, or if a portion of the Mount close to the process device is not correctly located with respect to the sensor tip of the temperature sensor. Furthermore, the determination of incorrect positioning of the temperature sensor can come from the switch located at a central part of the temperature determination device, where for example a wall portion of the Mount is incorrectly spaced or located with respect to an adjacent part of the temperature sensor, thereby indicating that the temperature data acquired is incorrect. It is also to be noted, that the switch is can operate together to provide further integrity of determination of temperature data. For example, it could be determined that the Mount is correctly positioned with respect to the process vessel device, but that the temperature sensor is incorrectly positioned with respect to the Mount. Thus, the temperature data acquired by the temperature sensor can be determined to be invalid. Additionally, it can be determined that the temperature sensor appears to be correctly positioned with respect to the process vessel or device. However, at the same time the Mount not to be correctly positioned with respect to the process vessel, such that the force fit of the temperature sensor to the process vessel may not actually be at the required level. Thus, the integrity of the temperature data required not to be trustworthy. Furthermore, the temperature sensor could be appear to be correctly positioned with respect to the process vessel from an associated switch, but the temperature sensor could be determined to be incorrectly located with respect to the Mount, again indicating that the temperature measurement data required by the temperature sensor could be invalid.

The position activated switch or position activated switches described and shown with respect to FIG. 3, can be the equivalent switches as described with respect to FIG. 2.

Figure 4:
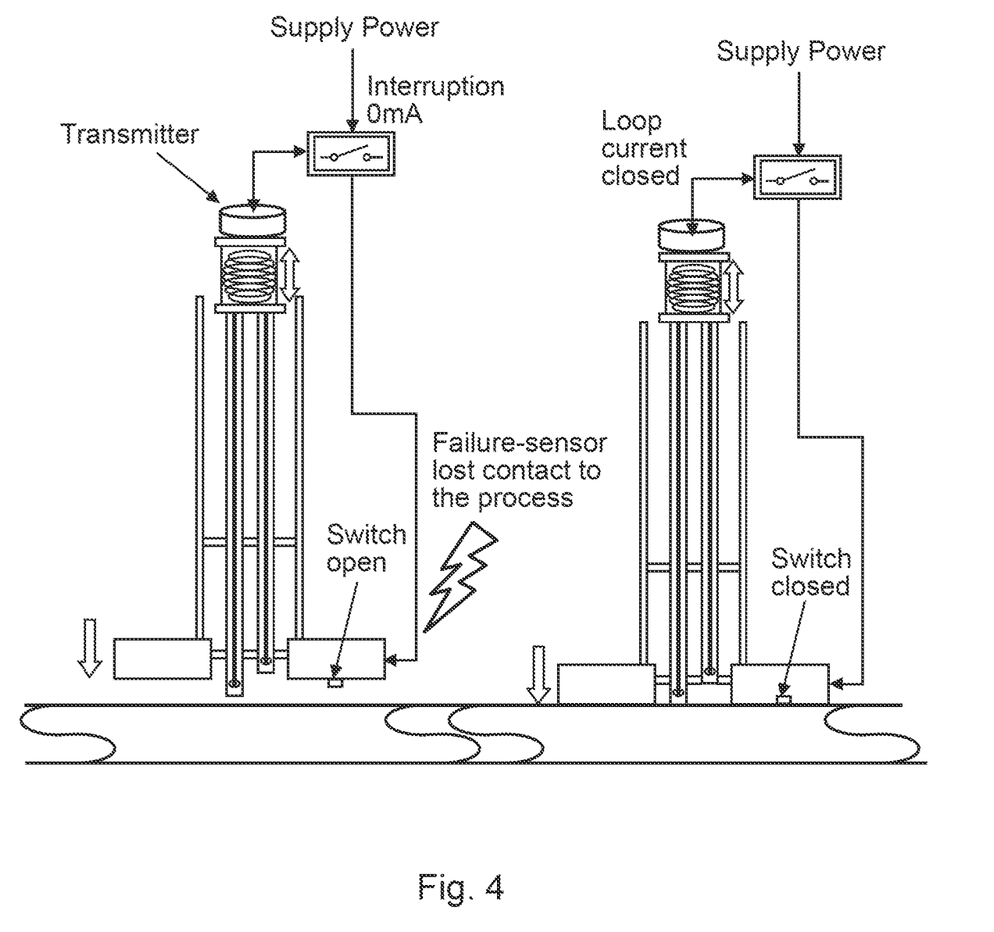
FIG. 4 shows an example of a temperature determination device on the left in an incorrect mounting situation and on the right in a correct mounting, where a force activated switch is utilized.

FIG. 4 shows an exemplar temperature determination device, where determination of the correct force fit connection of a non-invasive (temperature) sensor to the process is undertaken through utilisation of the connection sensor that is configured to acquire force activation or activated switch data associated with a force sensor. In this embodiment, the force sensor is located between the Mount and the process vessel device, and can determine if the Mount is correctly connected to the process vessel device. In the left hand image of FIG. 4, the Mount is spaced from the process device and force activation data indicates that the associated acquired temperature data may not be valid. In the right hand image, the Mount is now correctly connected to the process device and accordingly the acquired temperature measurement data from the temperature sensor can be treated accordingly. Additionally, or alternatively a force sensor can be associated with tip of the temperature sensor itself, thus indicating if the temperature sensor is correctly positioned with respect to the process device on the basis of the force data acquired, which could be over a range of forces or an on off force activated switch sensor as shown in the specific embodiment of FIG. 4. The force activation switch data can relate to:

Position activated switch realized as a force dependent switch that reacts in case the instrument loses its mechanical connection to the process.

Switch activated by knowledge of the correct force—or distance value, or through setting the correct value after mounting as a commissioning step Switch is connected to the transmitter where the diagnostic information is determined, or Switch is connected to an independent unit, that is connected to the transmitter current loop that can manipulate its loop current (e.g. simple interruption with 0 mA loop current or another valid alarm signal)

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A temperature determination device, comprising:
a non-invasive temperature sensor;
a mount;
and
at least one connection sensor, the at least one connection sensor comprising one or more proximity sensors;
wherein the non-invasive temperature sensor is configured to be connected to a process device via the mount,
wherein the non-invasive temperature sensor is configured to acquire temperature data,
wherein the at least one connection sensor is configured to acquire a connection status data relating to connection of the non-invasive temperature sensor to the process device, wherein the connection status data comprises proximity data,
wherein the one or more proximity sensors are configured to determine a first proximity between the mount and the process device and to determine a second proximity between the mount and the non-invasive temperature sensor,
wherein the proximity data comprises the first proximity between the mount and the process device and the second proximity between the mount and the non-invasive temperature sensor, and
wherein the temperature determination device is configured to utilize the temperature data and the connection status data with respect to a determination of a temperature of the process device, and wherein utilization of the connection status data with respect to the determination of the temperature of the process device comprises a comparison of the proximity data against baseline proximity data, and wherein the baseline proximity data relates to a correct position of the non-invasive temperature sensor with respect to the mount.

2. The temperature determination device according to claim 1, wherein the at least one connection sensor comprises one or more position activated switches, and
wherein the connection status data comprises position activation data.

3. The temperature determination device according to claim 2, further comprising a position activated switch configured to determine a position status between the mount and the process device,
wherein the position activation data comprises the determined position status between the mount and the process device.

4. The temperature determination device according to claim 2, wherein the one or more position activated switches is configured to determine a position status between the mount and the non-invasive temperature sensor, and
wherein the position activation data comprises the determined position status between the mount and the non-invasive temperature sensor.

5. The temperature determination device according to claim 2, wherein utilization of the connection status data with respect to the determination of a temperature of the process device comprises a comparison of the position activation data against baseline position activation data.

6. The temperature determination device according to claim 1, wherein the at least one connection sensor comprises one or more force activated switches, and
wherein the connection status data comprises force activation data.

7. The temperature determination device according to claim 6, wherein the one or more force activated switches is configured to determine a force status between the mount and the process device, and
wherein the force activation data comprises the determined force status between the mount and the process device.

8. The temperature determination device according to claim 6, wherein the one or more force activated switches is configured to determine a force status between the mount and the non-invasive temperature sensor, and
wherein the force activation data comprises the determined force status between the mount and the non-invasive temperature sensor.

9. The temperature determination device according to claim 6, wherein utilization of the connection status data with respect to the determination of the temperature of the process device comprises a comparison of the force activation data against baseline force activation data.

10. The temperature determination device according to claim 1, wherein the temperature determination device is configured to transmit the connection status data.

11. The temperature determination device according to claim 1, wherein the temperature determination device is configured to transmit the temperature data.

12. The temperature determination device according to claim 1, wherein the baseline proximity data relates to a correct position of the non-invasive temperature sensor with respect to the process device.

13. The temperature determination device according to claim 1, wherein the baseline proximity data relates to a correct distance value of the non-invasive temperature sensor with respect to the process device.

14. The temperature determination device according to claim 1, wherein the baseline proximity data relates to a correct distance value of the non-invasive temperature sensor with respect to the mount.

* * * * *